US010175309B2

(12) United States Patent
Li et al.

(10) Patent No.: US 10,175,309 B2
(45) Date of Patent: Jan. 8, 2019

(54) MAGNETO-IMPEDANCE SENSING DEVICE AND MANUFACTURING METHOD THEREOF

(71) Applicant: PROLIFIC TECHNOLOGY INC., Taipei (TW)

(72) Inventors: Hung-Ta Li, Kaohsiung (TW); Po-Feng Lee, Hsinchu (TW)

(73) Assignee: PROLIFIC TECHNOLOGY INC., Taipei (TW)

( * ) Notice: Subject to any disclaimer, the term of this patent is extended or adjusted under 35 U.S.C. 154(b) by 22 days.

(21) Appl. No.: 15/260,501

(22) Filed: Sep. 9, 2016

(65) Prior Publication Data

US 2017/0074950 A1    Mar. 16, 2017

(30) Foreign Application Priority Data

Sep. 10, 2015  (TW) ............................. 104129965 A

(51) Int. Cl.
*G01R 33/06* (2006.01)
*G01R 33/00* (2006.01)
(Continued)

(52) U.S. Cl.
CPC ....... *G01R 33/063* (2013.01); *G01R 33/0052* (2013.01); *H01L 43/08* (2013.01); *H01L 43/12* (2013.01)

(58) Field of Classification Search
CPC ............ G01R 31/2894; G01R 31/2853; G11C 29/022; G11C 29/816
(Continued)

(56) References Cited

U.S. PATENT DOCUMENTS 6,617,972 B2 * 9/2003 Takarada ........... G08B 21/0484
324/538
7,224,161 B2  5/2007 Honkura et al.
(Continued)

FOREIGN PATENT DOCUMENTS

CN       1533506 A    9/2004
CN       1533613 A    9/2004
(Continued)

OTHER PUBLICATIONS

Chinese Office Action dated Jul. 4, 2018.

*Primary Examiner* — Giovanni Astacio-Oquendo
(74) *Attorney, Agent, or Firm* — Rabin & Berdo, P.C.

(57) ABSTRACT

An electromagnetic impedance sensing device includes a first substrate, a first patterned conductive layer, a second substrate, a second patterned conductive layer, a magneto-conductive wire and an encapsulation layer. The first substrate has a first surface, and the first patterned conductive layer is formed on the first surface. The second substrate has a second surface facing to the first surface, and the second patterned conductive layer is formed on the second surface and electrically contacted to the first patterned conductive layer. The first and second patterned conductive layers are physically integrated to define an accommodation space allowing the magneto-conductive wire passing there through. The magneto-conductive wire is encapsulated by the encapsulation layer to make the magneto-conductive wire electrically isolated from the first and second patterned conductive layers, respectively. At least one coil circuit surrounding the magneto-conductive wire is formed by the first and second patterned conductive layers.

9 Claims, 11 Drawing Sheets

(51) Int. Cl.
*H01L 43/12* (2006.01)
*H01L 43/08* (2006.01)

(58) Field of Classification Search
USPC .................................. 324/71.11, 73.1, 76.11
See application file for complete search history.

(56) References Cited

U.S. PATENT DOCUMENTS

| | | | | |
|---|---|---|---|---|
| 8,093,161 | B2 * | 1/2012 | Bansal | D01F 8/06 |
| | | | | 442/334 |
| 8,378,670 | B1 | 2/2013 | Honkura et al. | |
| 8,410,006 | B2 * | 4/2013 | Chappas | B01D 39/04 |
| | | | | 428/364 |
| 8,461,834 | B2 | 6/2013 | Honkura et al. | |
| 8,779,729 | B2 * | 7/2014 | Shiraishi | G01R 31/3606 |
| | | | | 320/134 |
| 9,303,342 | B2 * | 4/2016 | Wang | B32B 5/08 |
| 2012/0098518 | A1 * | 4/2012 | Unagami | G01R 22/066 |
| | | | | 324/74 |

FOREIGN PATENT DOCUMENTS

| | | |
|---|---|---|
| CN | 101815953 A | 8/2010 |
| CN | 102334040 A | 1/2012 |

* cited by examiner

MAGNETO-IMPEDANCE SENSING DEVICE AND MANUFACTURING METHOD THEREOF

This application claims the benefit of Taiwan application Serial No. 104129965, filed Sep. 10, 2015, the disclosure of which is incorporated by reference herein in its entirety.

TECHNICAL FIELD

The disclosure relates in general to a semiconductor device and manufacturing method thereof, and more particularly to an electromagnetic impedance sensing device and a manufacturing method thereof.

BACKGROUND

As consumer electronics, such as mobile phones and electronic compasses, and conventional products, such as motors and brakes, become more and more poplar, the demand for electromagnetic impedance sensing devices becomes ever increasing.

Currently, most electromagnetic impedance sensing devices use ceramic substrate as the base. A magneto-conductive wire is fixed on the ceramic substrate by alternatively stacking a at least two patterned conductive layers, a patterned insulating layer and the magneto-conductive wire, and an induction coil circuit made of the magneto-conductive wire surrounded by the patterned conductive layers and the patterned insulating layer is formed. However, during the forming of the induction coil circuit, each process either for forming the patterned conductive layers or for forming the patterned insulating layer should include an individual alignment step to make the resulted structure align with the magneto-conductive wire, and the manufacturing process is thus very time consuming. Furthermore, since the magneto-conductive wire is hard to fix and there may exist a step height between the magneto-conductive wire and the ceramic substrate, thus it is difficult to uniformly coat the photoresists used for patterning the conductive layers and the insulating layer. Consequently, defocus problems in the photolithography process may arise, and the yield of the process can be deteriorated. Since the conductive layer and the insulating layer fluctuate with the shape of the magneto-conductive wire, the subsequent step of manufacturing the electrode pads will be affected, and the critical dimension of the electromagnetic impedance sensing device becomes very difficult to be further miniaturized. Thus, the number of coils cannot be increased, and the sensitivity of the electromagnetic impedance sensing device is hard to be enhanced.

Therefore, it has become a prominent task for the industries to provide an advanced electromagnetic impedance sensing device and a manufacturing method thereof to resolve the problems encountered in the prior art.

SUMMARY

One aspect of the present disclosure relates to an electromagnetic impedance sensing device, including a first substrate, a first patterned conductive layer, a second substrate, a second patterned conductive layer, a magneto-conductive wire and an encapsulation layer. The first substrate has a first surface, and the first patterned conductive layer is formed on the first surface. The second substrate has a second surface facing to the first surface, and the second patterned conductive layer is formed on the second surface and electrically contacted to the first patterned conductive layer. The first and second patterned conductive layers are physically integrated to define an accommodation space allowing the magneto-conductive wire passing there through. The magneto-conductive wire is encapsulated by the encapsulation layer to make the magneto-conductive wire electrically isolated from the first and second patterned conductive layers, respectively. At least one coil circuit surrounding the magneto-conductive wire is formed by the first and second patterned conductive layers.

In one embodiment of the present disclosure, the first surface has a first trench. A portion of the first patterned conductive layer is formed on first sidewalls and a bottom surface of the trench and integrated with the second patterned conductive layer to define the accommodation space.

In one embodiment of the present disclosure, the second surface has a second trench. A portion of the second patterned conductive layer is formed on second sidewalls and a bottom surface of the second trench and integrated with the portion of the first patterned conductive layer formed on the sidewalls and the bottom surface of the first trench to define the accommodation space.

In one embodiment of the present disclosure, the first trench and the second trench are entirely filled up by the encapsulation layer.

In one embodiment of the present disclosure, the first and second substrates are made of a semiconductor material. The electromagnetic impedance sensing device further includes a first insulating layer disposed between the first substrate and the first patterned conductive layer and a second insulating layer disposed between the second substrate and the second patterned conductive layer.

Another aspect of the present disclosure relates to a method for manufacturing an electromagnetic impedance sensing device. The method includes processes as follows: Firstly, a first patterned conductive layer is formed on a first surface of a first substrate; and a second patterned conductive layer is formed on a second surface of a second substrate. Next, a magneto-conductive wire is disposed on the first surface in a manner of electrically isolated from the first patterned conductive layer. Then, the first and second substrates are bonded together, so as to make the first and second patterned conductive layers electrically contacted each other and to define an accommodation space allowing the magneto-conductive wire passing there through, whereby at least one coil circuit surrounding the magneto-conductive wire is formed by the first and second patterned conductive layers.

In one embodiment of the present disclosure, the process of disposing the magneto-conductive wire disposed on the first surface includes steps as follows: The magneto-conductive wire is disposed in a first trench formed on the first surface. The encapsulation layer is then formed to encapsulate the magneto-conductive wire, so as to make the magneto-conductive wire electrically isolated from the portion of the first patterned conductive layer that is formed on the sidewalls and the bottom surface of the first trench.

In one embodiment of the present disclosure, a second trench is formed on the second surface. A portion of the second patterned conductive layer is disposed on the sidewalls and the bottom surface of the second trench and integrated with the portion of first patterned conductive layer that is formed on the sidewalls and the bottom surface of the first trench to define the accommodation space.

In one embodiment of the present disclosure, the first and second substrates are made of a semiconductor material, and before the forming of the first and second patterned conductive layers, the method further includes steps of forming a first insulating layer on the first surface and forming a second insulating layer on the second surface.

In one embodiment of the present disclosure, after the forming of the coil circuit, the method further includes steps as follows: Firstly, the first substrate is thinned. Next, a plurality of via-plugs penetrating the first substrate and the first insulating layer are formed to electrically contact at least one of the magneto-conductive wire, the first patterned conductive layer and the second patterned conductive layer. Then, a patterned circuit layer is formed on a third surface of the first substrate opposite to the first surface, wherein the patterned circuit layer includes a plurality of pads each of which electrically connects to one of the via-plugs.

According to the above embodiments of the present disclosure, an electromagnetic impedance sensing device is provided by semiconductor manufacturing technology. Firstly, two patterned conductive layers are formed on two substrates respectively. Then, the two substrates are bonded together to make the two patterned conductive layers disposed on different substrates electrically contacting with each other and to define an accommodation space there between allowing a magneto-conductive wire passing through, whereby at least one coil circuit surrounding the magneto-conductive wire is formed.

During the process of manufacturing the electromagnetic impedance sensing device, except for the step of bonding the two substrates, any other aligning process used to align the magneto-conductive wire with one of the patterned conductive layers is no more necessary. Additionally, since the encapsulation layer is formed by directly filling an insulating material into the two trenches that are respectively formed on the two substrates used to define the accommodation space, thus extra step for patterning the encapsulation layer can be omitted, and the manufacturing process can be simplified and the manufacturing time can be reduced. Besides, because the two patterned conductive layers are both formed on a relatively flat surface, the defocus problems of the photolithography process can be avoided by virtue of the fact that the step height existing between the magneto-conductive wire and the substrate can be eliminated by fixing the magneto-conductive wire in the trenches and the subsequent process can be performed on a relatively flat surface. Thus, the objects of reducing feature size, increasing the number of coils and enhancing element sensitivity can be achieved accordingly. In addition, the aforementioned process can be applied by a wafer scaled process which allows multiple electromagnetic impedance sensing devices being manufactured, packaged and tested on one wafer, thus the process efficiency for manufacturing the electromagnetic impedance sensing devices can be greatly increased.

The above and other aspects of the present disclosure will become better understood with regard to the following detailed description of the preferred but non-limiting embodiment (s). The following description is made with reference to the accompanying drawings.

BRIEF DESCRIPTION OF THE DRAWINGS

FIGS. 1A' to 1G' are top views of the process structure depicted in FIGS. 1A to 1G;

FIGS. 2A' to 2D' are top views of the process structure depicted in FIGS. 2A to 2D.

DETAILED DESCRIPTION

The present disclosure provides an electromagnetic impedance sensing device and a manufacturing method thereof. For the object, technical features and advantages of the present invention to be more easily understood by anyone ordinary skilled in the technology field, a number of exemplary embodiments are disclosed below with detailed descriptions and accompanying drawings. It should be noted that these embodiments are for exemplification purpose only, not for limiting the scope of protection of the invention. The invention can be implemented using other features, elements, methods and parameters. The preferred embodiments are merely for illustrating the technical features of the invention, not for limiting the scope of protection of. Anyone skilled in the technology field of the invention will be able to make suitable modifications or changes based on the specification disclosed below without breaching the spirit of the invention. Designations common to the accompanying drawings are used to indicate identical or similar elements.

Figure 1A:
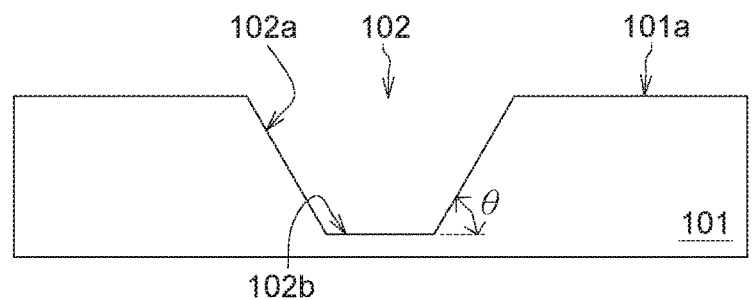
FIGS. 1A to 1G are a cross-sectional views illustrating the process for manufacturing an electromagnetic impedance sensing device according to an embodiment of the present disclosure.
Figure 1A:
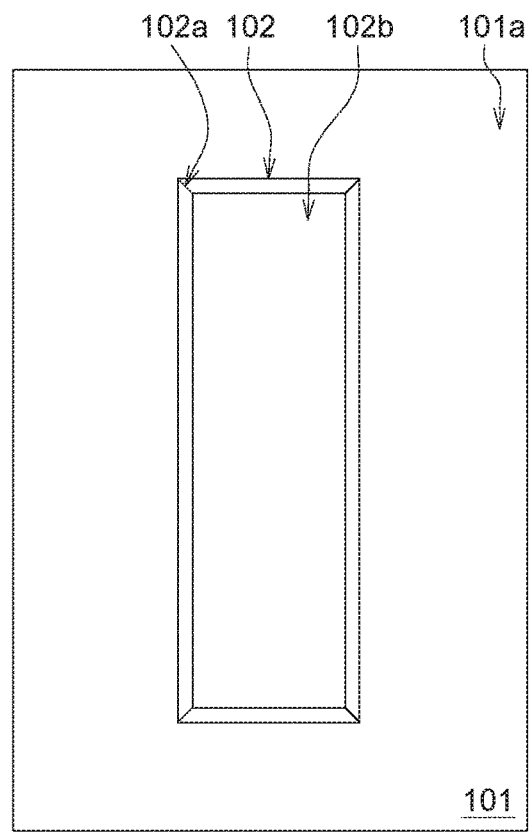

FIGS. 1A to 1G are cross-sectional views illustrating the process for manufacturing an electromagnetic impedance sensing device 100 according to an embodiment of the present disclosure. FIGS. 1A' to 1G' are top views of the process structure depicted in FIGS. 1A to 1G. The process for manufacturing of the electromagnetic impedance sensing device 100 includes steps as follows:

Refer to FIG. 1A and FIG. 1A'. Firstly, a substrate 101 is provided. In some embodiments of the present disclosure, the substrate 101 can be made of a semiconductor material, a ceramic material, a plastic material or other materials suitable for carrying an electronic element. In some embodiments of the present disclosure, the substrate 101 can be made of a semiconductor material, such as a material containing silicon (Si), silicon germanium (SiGe), gallium arsenide (GaAs), silicon carbide (SiC) or the arbitrary combinations thereof. In some other embodiments of the present disclosure, the substrate 101 can be realized by a carrying substrate containing a plastic material or a ceramic material, such as printed circuit board (PCB), a flexible printed circuit (FPC) board or a ceramic substrate containing alumina. In the present embodiment, the substrate 101 preferably is realized by a silicon wafer.

Next, a trench 102 is formed on a surface 101a of the substrate 101. In some embodiments of the present disclosure, the trench 102 can be formed on the surface 101a of the substrate 101 by way of etching, cutting, grinding, casting or molding other possible methods. In the present embodiment, the trench 102 is formed by a wet etching process, for example, the silicon wafer (the substrate 101) is etched using a potassium hydroxide (KOH)-containing etching agent to form the trench 102 on the surface 101a of the substrate 101 having a lattice arrangement direction (1,0,0). The sidewalls 102a of the trench 102 and the surface 101a of the substrate 101 form a chamfer angle θ of 54.7° (see FIG. 1A).

Figure 1B:
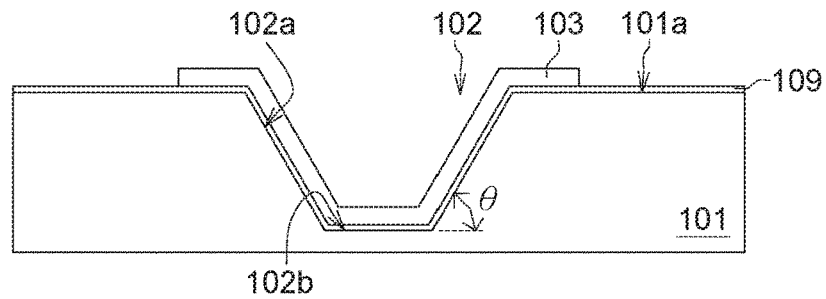
Figure 1B:
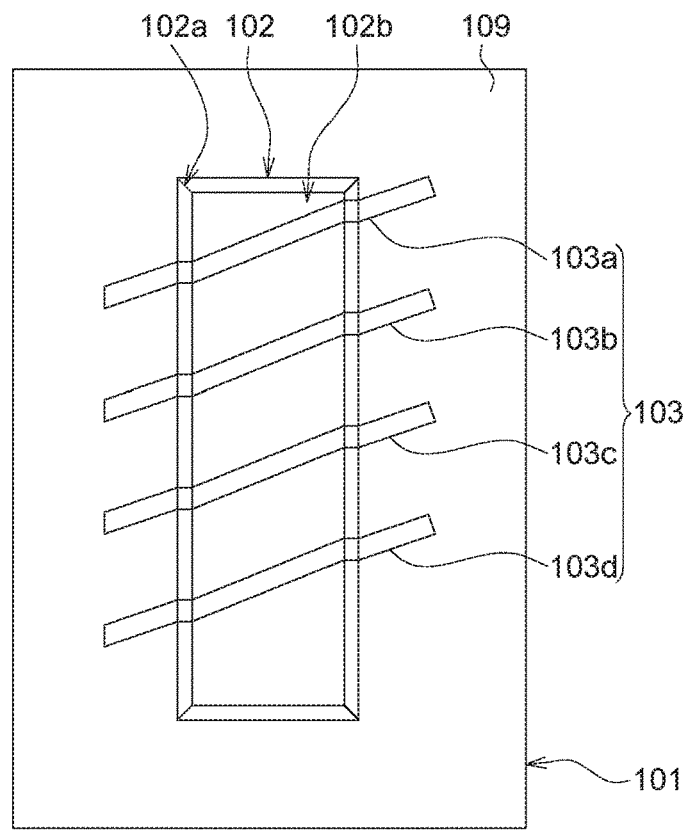

Then, a patterned conductive layer 103 is formed on the surface 101a of the substrate 101. Refer to FIG. 1B and FIG. 1B'. In some embodiments of the present disclosure, the forming of the patterned conductive layer 103 includes following steps. Firstly, a metal layer, e.g. a layer containing copper (Cu), aluminum (Al), tungsten (W) or the arbitrary combinations thereof, is formed on the surface 101a of the substrate 101 as well as the sidewalls 105a and the bottom surface 105b of the trench 105 by a deposition process, such as a chemical vapor deposition process, a physical vapor deposition process or an electroplating process. Then, a portion of the metal layer is removed by a lithography etching process. In the present embodiment, a copper layer is formed on the surface 101a of the substrate 101 as well as the sidewalls 102a and the bottom surface 102b of the trench 102 by an electroplating process. Then, the copper layer is patterned by a dry etching process, such as reactive ion etching (RIE) process, to from a patterned conductive layer 103 on the surface 101a of the substrate 101. As shown in FIG. 1B', the patterned conductive layer 103 includes a plurality of conductor strips, such as conductor strips 103a, 103b, 103c and 103d, separated from one another, formed on the surface 101a of the substrate 101, and extending across the trench 102. Each of the conductor strips 103a, 103b, 103c and 103 conformally cover on the bottom surface 102b and the sidewalls 102a of the trench 102.

In should be noted that in some embodiments of the present disclosure, before the forming of the patterned conductive layer 103, preferably an insulating layer 109 may be formed on the surface 101a of the substrate 101 by a deposition process or an oxidation process. In the present embodiment, the insulating layer 109 is a silica ($SiO_2$) layer formed by a chemical vapor deposition process and to conformally cover on the surface 101a of the substrate 101 (silicon wafer) as well as the sidewalls 102a and the bottom surface 102b of the trench 102 (as shown in FIG. 1B and FIG. 1B').

After the patterned conductive layer 103 is formed, a magneto-conductive wire 104 is disposed on the surface 101a of the substrate 101, wherein the magneto-conductive wire 104 is electrically isolated from the patterned conductive layer 103. The magneto-conductive wire 104 can be made of a material selected from a group consisting of amorphous ferromagnetic material, anti-ferromagnetic material, non-ferromagnetic metal material, tunnel oxide material and the arbitrary combinations thereof. In some embodiments of the present disclosure, the magneto-conductive wire 104 can be made of a ferromagnetic material containing one of the metal elements including nickel (Ni), iron (Fe), cobalt (Co) and copper (Cu) or containing the alloy constituted by the arbitrary combinations thereof. For example, the magneto-conductive wire 108 can be made of a CoFeB-based alloy or a CoFeSiB-based alloy.

Figure 1C:
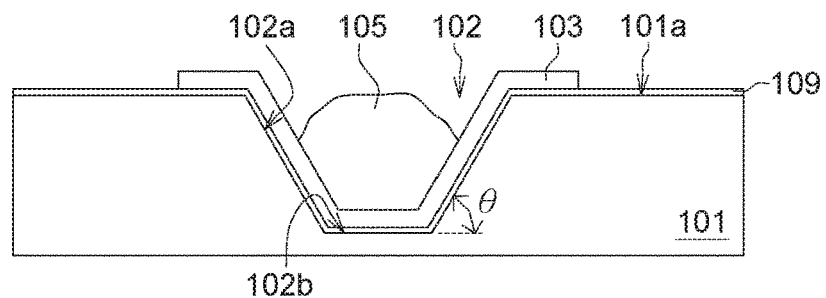
Figure 1C:
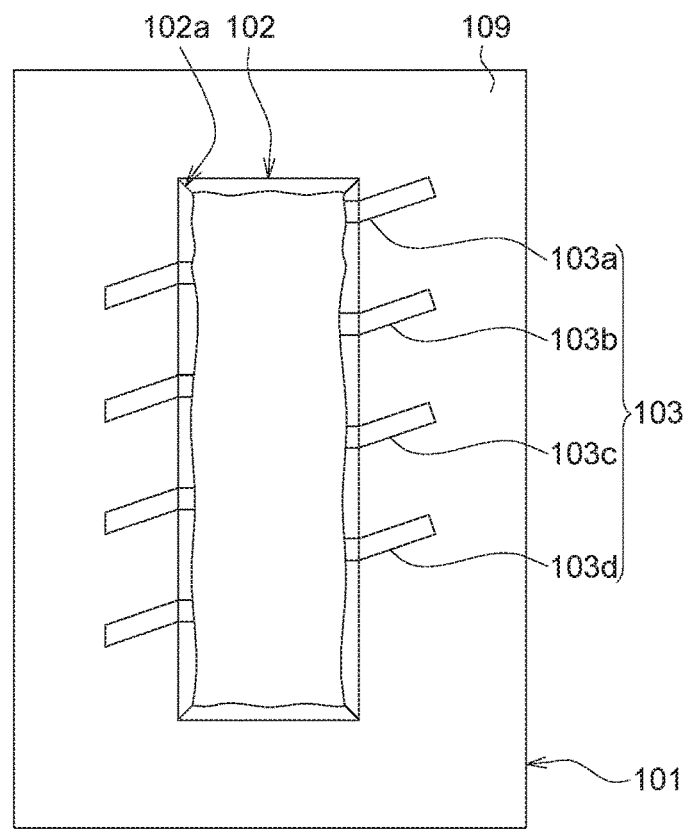
Figure 1D:
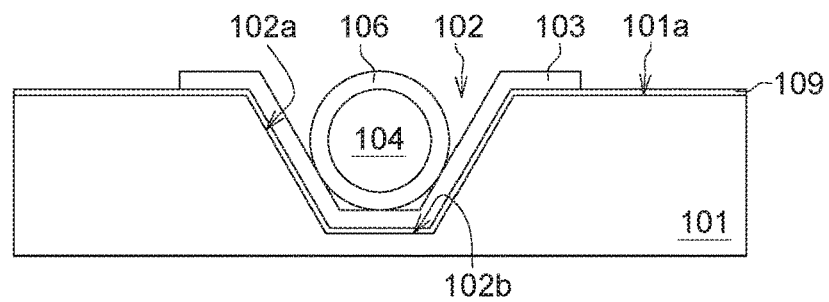
Figure 1D:
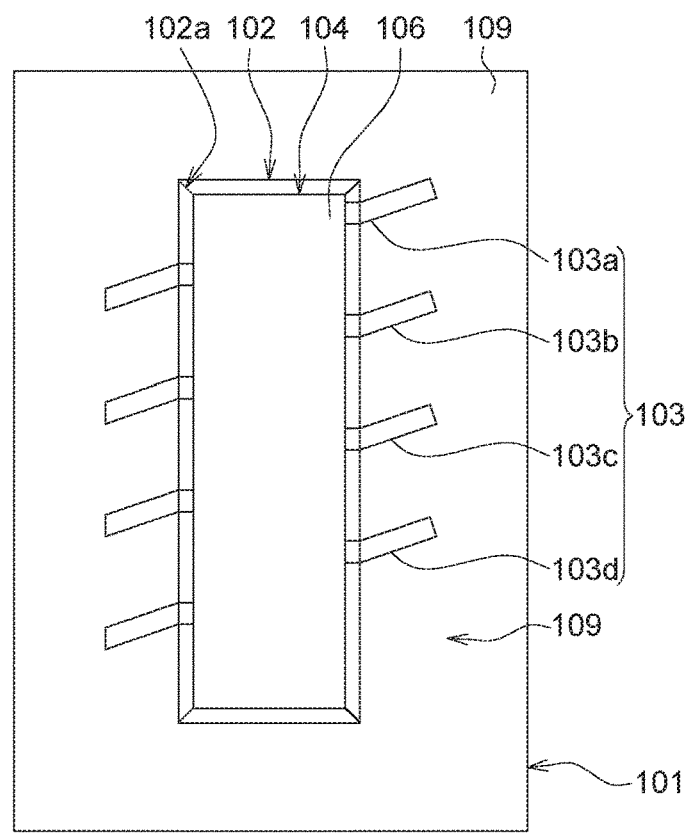

In the present embodiment, the magneto-conductive wire 104 is made of a CoFeSiB base alloy material, and the process of disposing the magneto-conductive wire 104 on the surface 101a of the substrate 101 includes following steps: Firstly, an insulating adhesive 105, such as epoxy or other suitable insulating material, is filled into the trench 102 (as shown in FIG. 10 and FIG. 1C'). Then, the magneto-conductive wire 104 is disposed in the trench 102 formed on the surface 101a of the substrate 101, such that the insulating adhesive 105 can be coated on an cylinder surface of the magneto-conductive wire 104 to form an encapsulation layer 106. In the present step, the encapsulation layer 106 at least encapsulates the portion of the cylinder surface of the magneto-conductive wire 104 adjacent to the sidewalls 102a and the bottom surface 102b of the trench 102, such that the magneto-conductive wire 104 can be electrically isolated from a portion of the patterned conductive layer 103 formed on the sidewalls 102a and the bottom surface 102b of the trench 102, such as the portion of the conductor strips 103a, 103b, 103c and 103d covering on the sidewalls 102a and the bottom surface 102b of the trench 102 (as shown in FIG. 1D and FIG. 1D'). In the present embodiment, the insulating adhesive 105 preferably does not entirely fill up the trench 102.

It should be noted that in other embodiments of the present disclosure, the insulating adhesive 105 can be filled into the trench 102 after the magneto-conductive wire 104 is disposed in the trench 102, and the encapsulation layer 106 made of the insulating cement 105 can completely encapsulate the cylinder surface of the magneto-conductive wire 104.

Figure 1E:
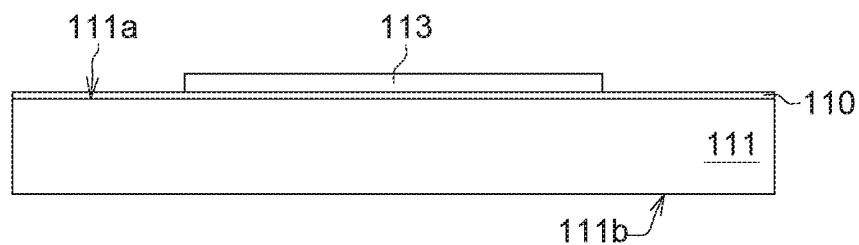
Figure 1E:
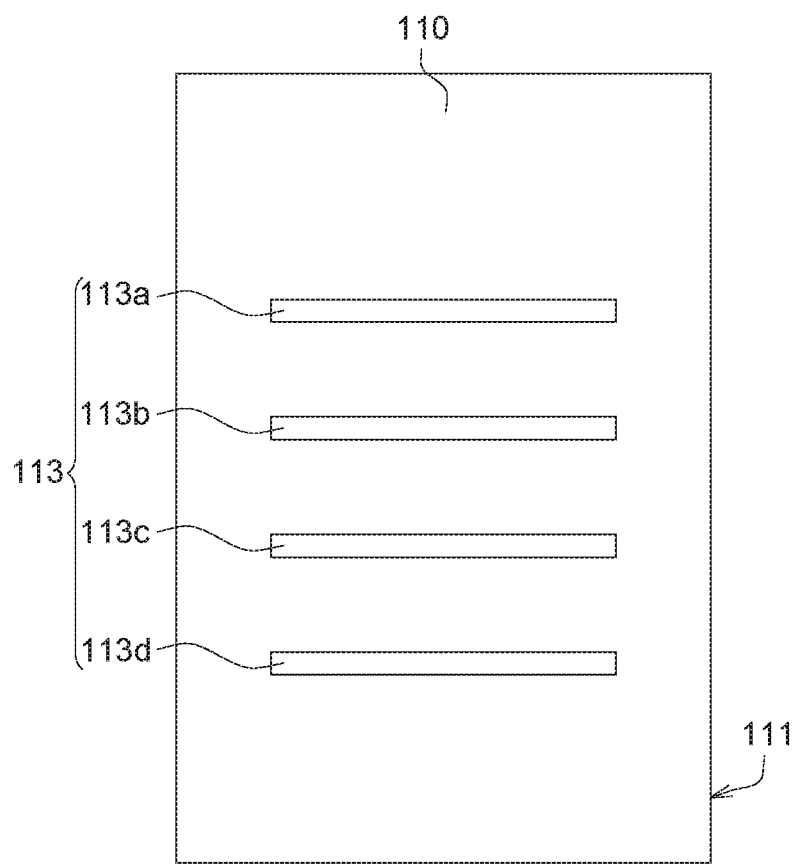

Refer to FIG. 1E and FIG. 1E'. Another substrate 111 having a patterned conductive layer 113 is provided, wherein, the patterned conductive layer 113 is formed on the surface 111a of the substrate 111. In some embodiments of the present disclosure, the substrate 111 and the substrate 101 can be made of identical or similar materials. In the present embodiment, both the substrate 111 and the substrate 101 are realized by a silicon wafer. Since the materials used for manufacturing the patterned conductive layer 113 is identical or similar to that used for manufacturing the patterned conductive layer 103, thus the similarities are not redundantly repeated here. In the present embodiment, before the patterned conductive layer 113 is formed, there is no any trench formed on the surface 111a of the substrate 111, and only a silica insulating layer 110 is formed on the surface 111a of the substrate 111. As shown in FIG. 1E', the patterned conductive layer 113 including a plurality of mutually separated conductor strips, such as conductor strips 113a, 113b, 113c and 113d, is formed on the surface 111a of the substrate 111.

In the embodiments of the present disclosure, the step sequence of providing the substrate 101 having the patterned conductive layer 103 and providing the substrate 111 having the patterned conductive layer 113 are not limited to a specific rule. For example, in some embodiments of the present disclosure, the step of providing substrate 101 having the patterned conductive layer 103 can be performed prior to the provision of the substrate 111 having the patterned conductive layer 113. In some other embodiments, the step of providing the substrate 111 having the patterned conductive layer 113 can be performed prior to the provision of the substrate 101 having the patterned conductive layer 103. In the present embodiment, the substrate 101 having the patterned conductive layer 103 and the substrate 111 having the patterned conductive layer 113 are provided at the same time.

Figure 1F:
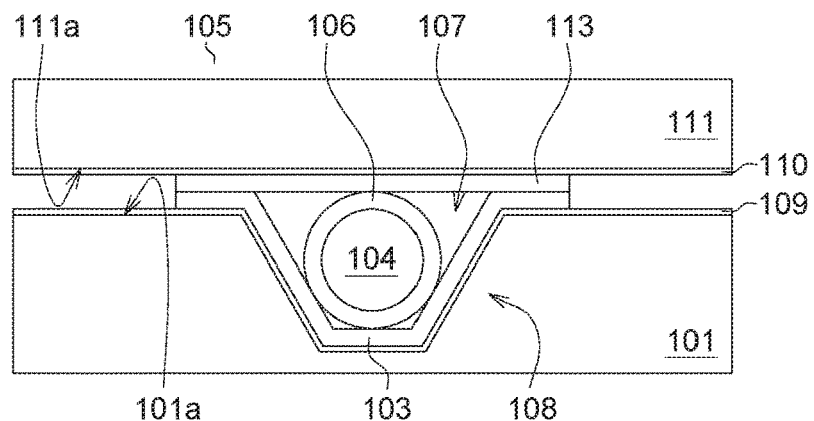
Figure 1F:
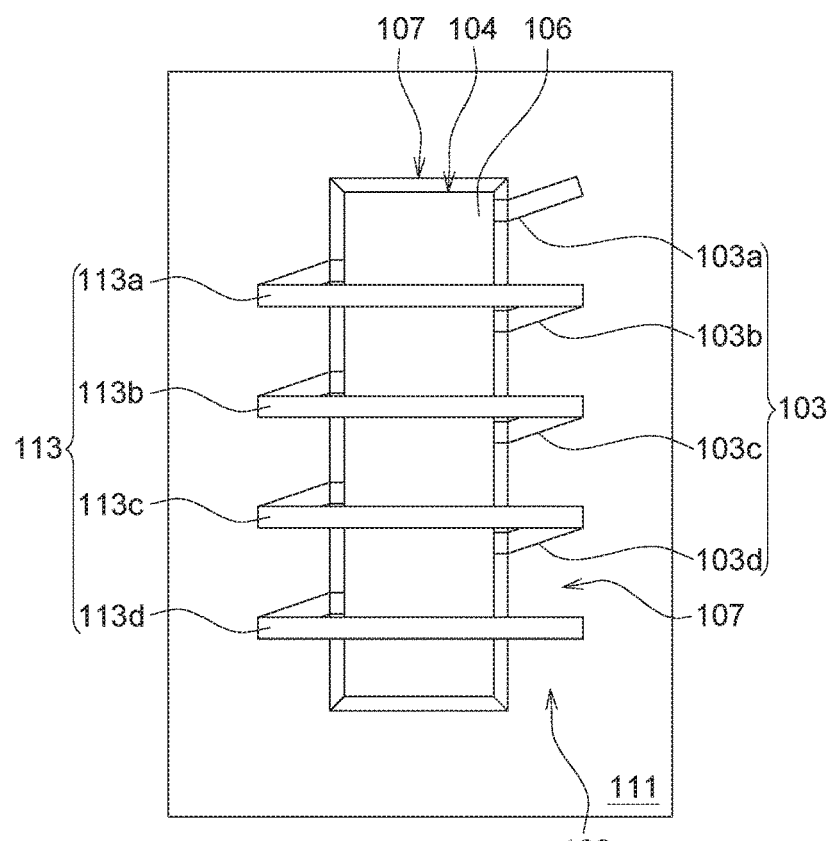

Then, a wafer bonding technology, such as fusion bonding process, metal compression bonding process or polymer adhesive bonding process, is applied to bond the surface 101a of the substrate 101 with the surface 111a of the substrate 111, so as to make the patterned conductive layer 103 and the patterned conductive layer 113 electrically contact each other. Refer to FIG. 1F and FIG. 1F'. One end of the conductor strip 103a of the patterned conductive layer 103 contacts to one end of the conductor strip 113a of the patterned conductive layer 113. The other end of the conductor strip 113a of the patterned conductive layer 113 contacts to one end of the conductor strip 103b of the patterned conductive layer 103. The other end of the conductor strip 103b of the patterned conductive layer 103 contacts to one end of the conductor strip 113b of the patterned conductive layer 113. The other end of the conductor strip 113b of the patterned conductive layer 113 contacts to one end of the conductor strip 103c of the patterned conductive layer 103. The other end of the conductor strip 103c of the patterned conductive layer 103 contacts to one end of the conductor strip 113c of the patterned conductive layer 113. The other end of the conductor strip 113c of the patterned conductive layer 113 contacts to one end of the conductor strip 103d of the patterned conductive layer 103. The other end of the conductor strip 103d of the patterned conductive layer 103 contacts to one end of the conductor strip 113d of the patterned conductive layer 113. As a result, an accommodation space 107 is defined by the portion of the conductor strip 103a, 103b, 103c and 103d covering on the sidewalls 102a and the bottom surface 102b of the trench 102 and the portion of the conductor strip 113a, 113b, 113c and 113d extending across the trench 102 to allow the magneto-conductive wire 104 passing there though, and thereby at least one coil circuit 108 surrounding the magneto-conductive wire 104 is formed.

When the external magnetic field applied to the magneto-conductive wire 104 changes, current pulse axially passing through the magneto-conductive wire 104 may occur, and an induced voltage may be output by the coil circuit 108 correspondingly, and the change in the external magnetic field can thus be determined. The direction of the current pulse axially flowing through the magneto-conductive wire 104 is reverse to the direction of the current flowing through the coil circuit 108.

In some embodiments of the present disclosure, before the substrate 101 and the substrate 111 are bonded together, because the trench 102 is filled up with the insulating adhesive 105 or the surface 111a of the substrate 111 facing to the trench 102 is coated with the insulating adhesive 105 (not illustrated), thus after the substrate 101 and the substrate 111 are bonded together, the insulating adhesive 105 can completely covering on the magneto-conductive wire 104, and the encapsulation layer 106 formed subsequently can completely encapsulate the cylinder surface of the magneto-conductive wire 104. As a result, the magneto-conductive wire 104 can be electrically isolated from the patterned conductive layer 113, such as the portions of the conductor strips 113a, 113b, 113c and 113d overlapping with the magneto-conductive wire 104 (as shown in FIG. 1F and FIG. 1F').

Afterwards, a wafer grinding technology is applied to thin the substrates 101 and 111 respectively. Then, a plurality of via-plugs, such as via-plugs 114a, 114b, 114c and 114d, are formed, wherein each of the via-plugs v 114a, 114b, 114c and 114d penetrates the substrate 101 or the substrate 111 and electrically contacts to one of the magneto-conductive wire 104, the patterned conductive layers 103 and 113. In the present embodiment, via-plugs 114a and 114b electrically contact to the conductor strip 103a of the patterned conductive layer 103 and the conductor strip 113d of the patterned conductive layer 113, respectively. The via-plugs 114c and 114d electrically contact to the two ends of the magneto-conductive wire 104, respectively.

Figure 1G:
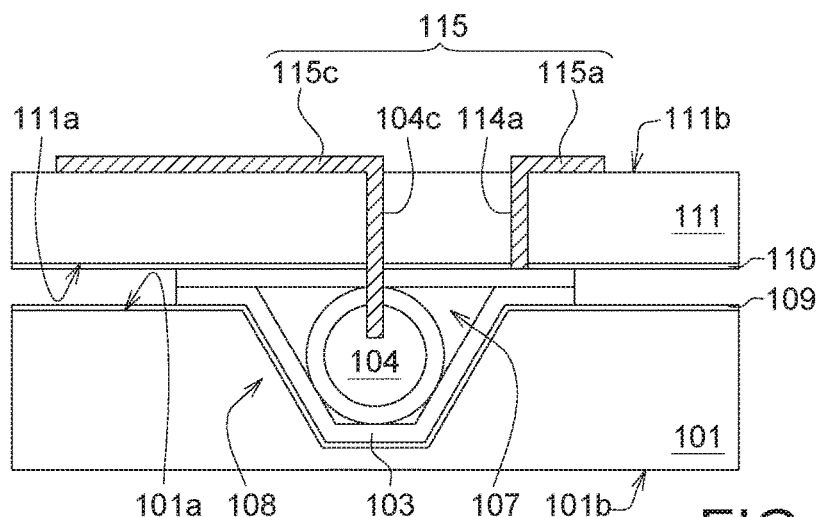
Figure 1G:
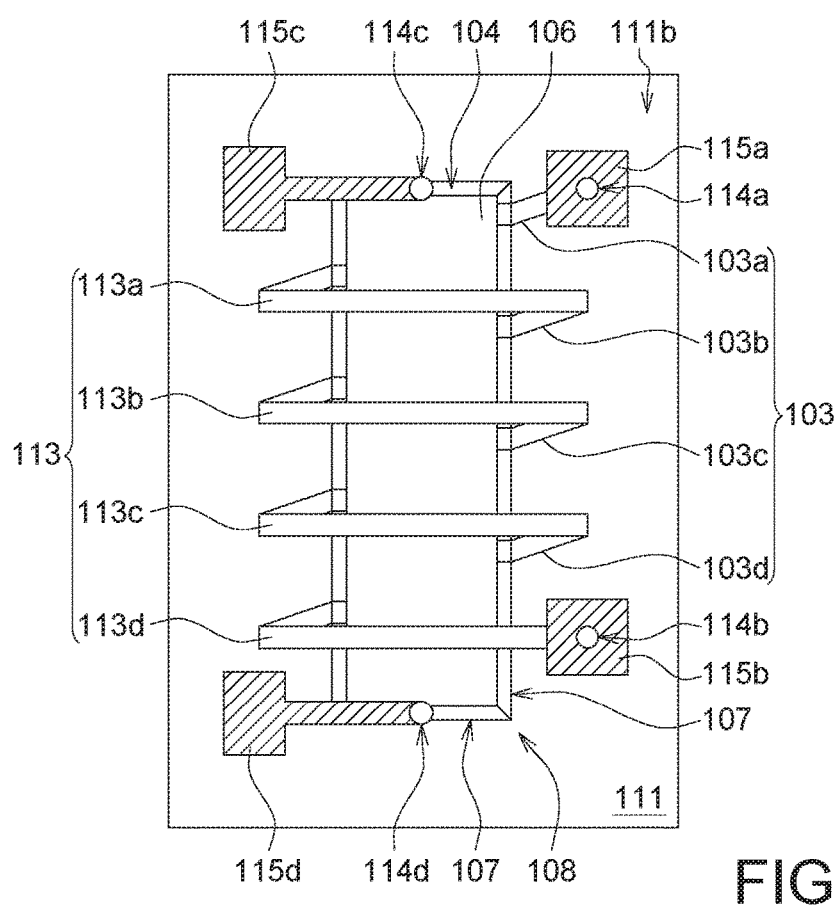

Then, a patterned circuit layer 115 is formed on a surface 101b of the substrate 101 or on a surface 111b of the substrate 111, wherein the surface 101b is opposite to the surface 101a of the substrate 101; the surface 111b is opposite to the surface 111a of the substrate 111, and the patterned circuit layer 115 includes a plurality of pads, such as solder pads 115a, 115b, 115c and 115d, each of which electrically connects to one of the via-plugs 114a, 114b, 114c and 114d. Meanwhile, the preparation of the electromagnetic impedance sensing element 100 (as shown in FIG. 1G and FIG. 1G') is completed. In some embodiments of the present disclosure, the circuit patterns and positions of the via-plugs 114a, 114b, 114c and 114d and the patterned circuit layer 115 can be defined by a photolithography process during the wafer etching process and the metal deposition process for fabricating the same.

In the present embodiment, the via-plugs 114a, 114b, 114c and 114d penetrate the substrate 111 and the insulating layer 110 and electrically contact to the patterned conductive layer 103, 113 and the magneto-conductive wire 104, respectively. However, in other embodiments of the present disclosure, the positions of the via-plugs 114a, 114b, 114c and 114d can be arranged according to the wiring requirements of the electromagnetic impedance sensing device 100, to make each of the contact windows 114a, 114b, 114c and 114d can electrically contact to at least one of the magneto-conductive wire 104, the patterned conductive layer 103 and the patterned conductive layer 113.

Figure 2A:
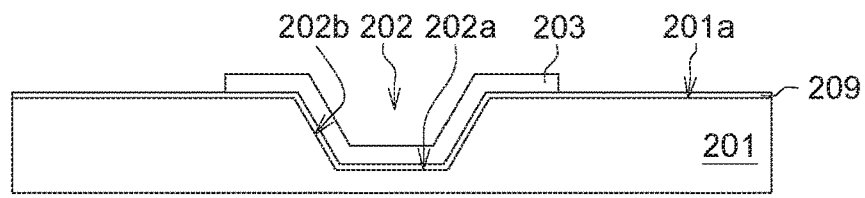
FIGS. 2A to 2D are a cross-sectional views illustrating the process for manufacturing an electromagnetic impedance sensing element according to another embodiment of the present disclosure.
Figure 2A:
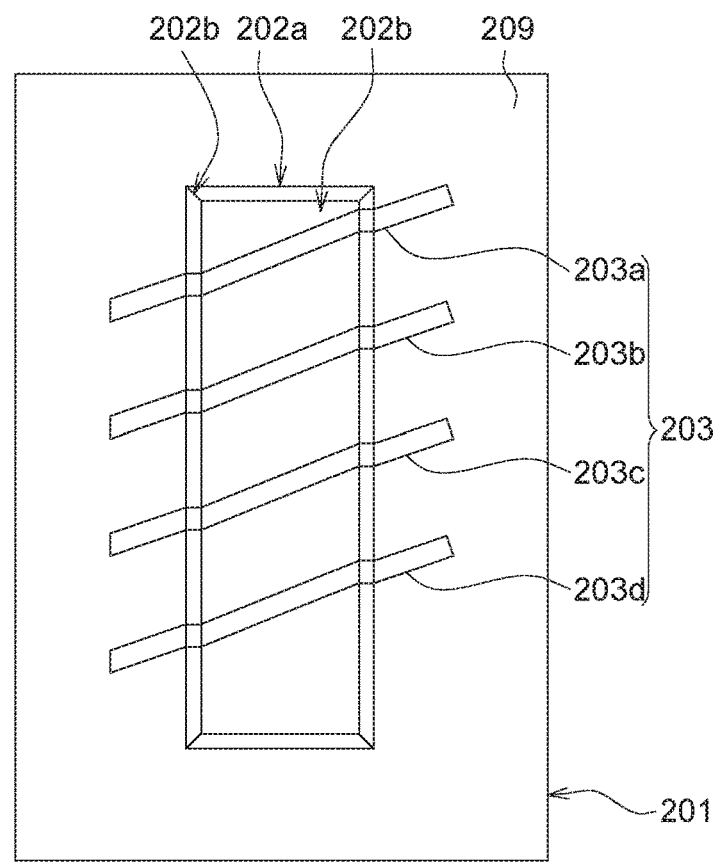

FIGS. 2A to 2D are cross-sectional views illustrating the process for manufacturing an electromagnetic impedance sensing device 200 according to another embodiment of the present disclosure. FIGS. 2A' to 2D' are top views of the process structure depicted in FIGS. 2A to 2D. The manufacturing method and the process structures of the electromagnetic impedance sensing device 200 are similar to that of the electromagnetic impedance sensing device 100 except that both the two substrates 201 and 211 used to form the electromagnetic impedance sensing device 200 have a trench respectively. For example, the substrate 201 has a trench 202 formed on the surfaces 201a of the substrates 201; and the substrate 211 has a trench 212 formed on the surfaces 211a of the substrates 211, and these two trenches 202 and 212 are used to define a accommodation space 207 allowing a magneto-conductive wire 204 passing there through.

Figure 2B:
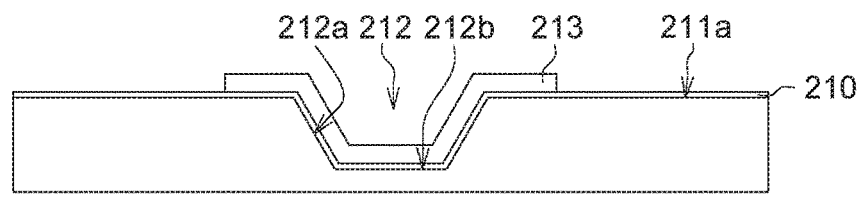
Figure 2B:
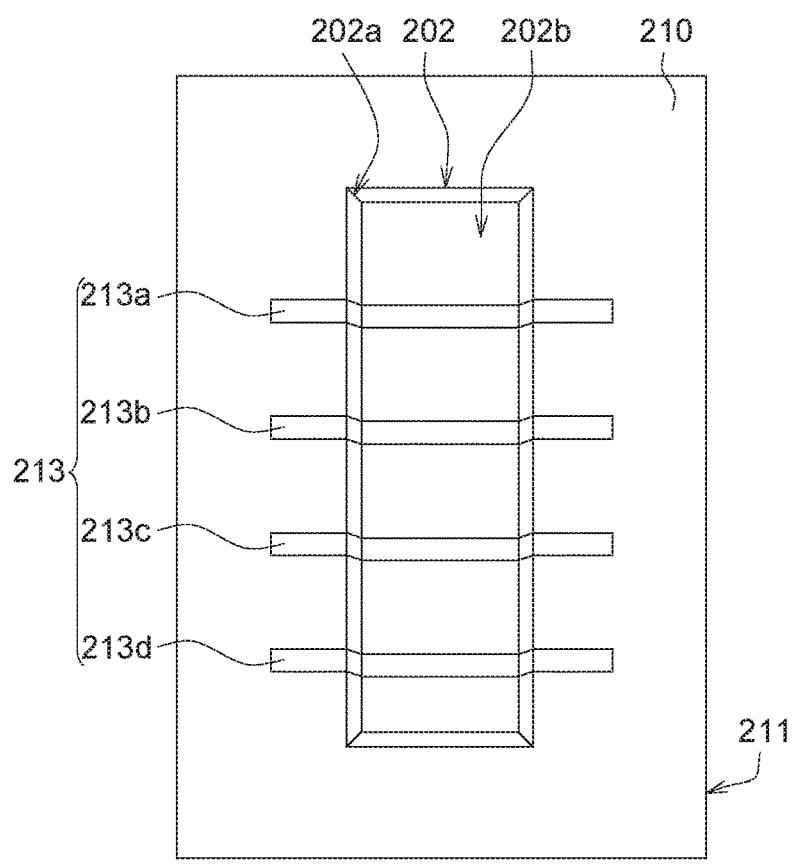

Firstly, the substrates 201 and 211 are provided; the trench 202, an insulating layer 209 and a patterned conductive layer 203 are formed on the surface 201a of the substrate 201 (as shown in FIGS. 2A and 2A'); and the trench 212, a insulating layer 210 and a patterned conductive layer 213 are formed on the surface 211a of the substrate 211 (as shown in FIGS. 2B and 2B'). In some embodiments of the present disclosure, the substrates 201 and 211 of the present embodiment and the substrate 101 of FIG. 1A and FIG. 1A' are made of the same material. In the present embodiment, both the substrates 201 and 211 are realized by two silicon wafers. Moreover, since the method and material for forming the trenches 202 and 212, the insulating layers 209 and 210 and the patterned conductive layers 203 and 213 on the substrates 201 and 211 are respectively similar or identical to that for forming the trench 102, the insulating layer 110 and the patterned conductive layer 103 as depicted in FIGS. 1A to 1B and FIGS. 1A' to 1B', thus the similarities are not redundantly repeated here. The trench 202 formed on the surface 201a of the substrate 201 and the trench 212 formed on the surface 211a of the substrate 211 have the same dimension in the present embodiment, but the dimensions thereof may not be limited to this regard, In some other embodiments, the trench 202 formed on the surface 201a of the substrate 201 and the trench 212 formed on the surface 211a of the substrate 211 may have different dimensions.

Figure 2C:
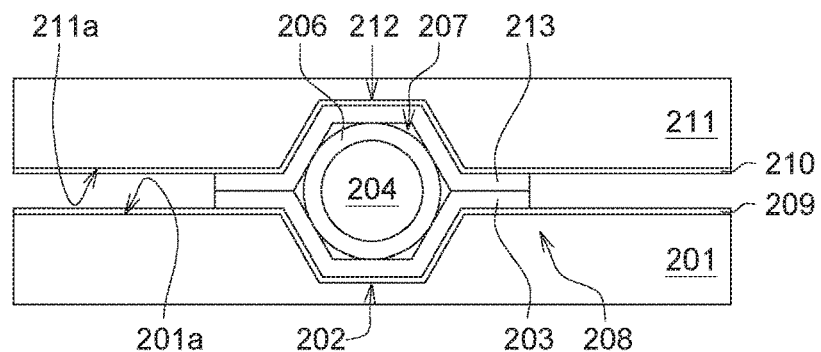
Figure 2C:
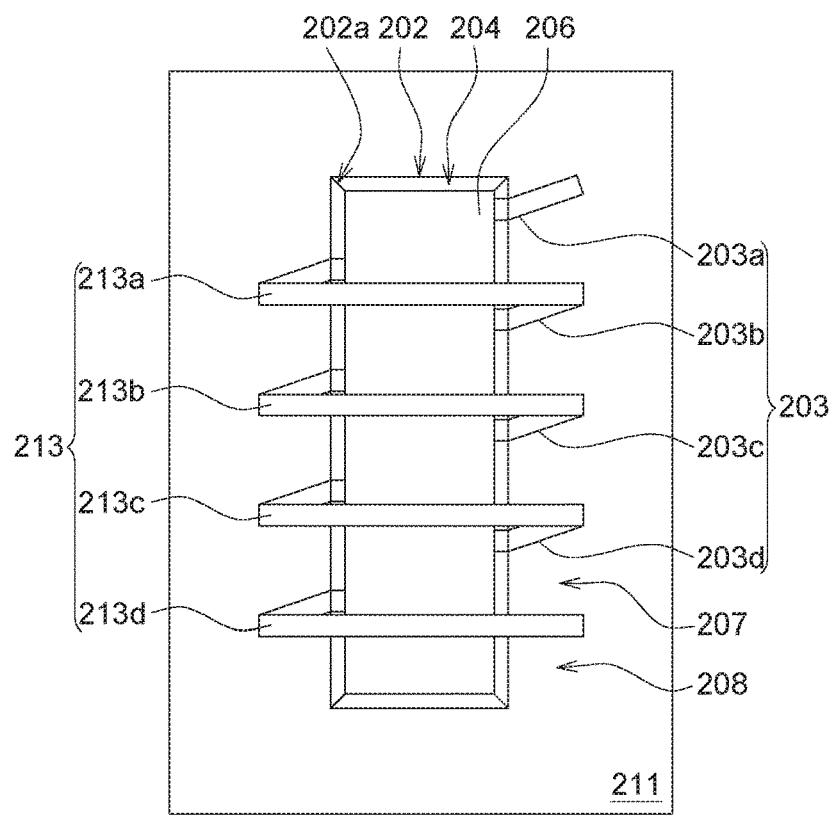

Then, an insulating adhesive (not illustrated) is filled into the trench 202 and then the magneto-conductive wire 204 is disposed in the trench 202 formed on the surface 201a of the substrate 201, so as to make the insulating adhesive 105 covering the magneto-conductive wire 204, whereby an encapsulation layer 206 is formed on the magneto-conductive wire 204 at least encapsulating a portion of the cylinder surface of the magneto-conductive wire 204 adjacent to sidewalls 202a and the bottom surface 202b of the trench 202. Such that the magneto-conductive wire 204 can be electrically isolated from the portion of the patterned conductive layer 203 that is disposed in the trench 202, such as the portion of the conductor strips 203a, 203b, 203c and 203d extending downwards to covering the sidewalls 202a and the bottom surface 202b of the trench 202. Then, a surface mounting technology, such as fusion bonding process, metal compression bonding process or polymer adhesive bonding process, is applied to bond the surface 201a of the substrate 201 with the surface 211a of the substrate 211, so as make the patterned conductive layers 203 and 213 electrically contact each other (as shown in FIG. 2C and FIG. 2C').

In the present embodiment, the bonding process of the surface 201a of the substrate 201 and the surface 211a of the substrate 211. includes steps of aligning the trench 202 formed on the surface 201a of the substrate 201 with the trench 212 formed on the surface 211a of the substrate 211. Whereby, one end of the conductor strip 203a of the patterned conductive layer 203 contacts to one end of the conductor strip 213a of the patterned conductive layer 213; the other end of the conductor strip 213a of the patterned conductive layer 213 contacts to one end of the conductor strip 203b of the patterned conductive layer 203; the other end of the conductor strip 203b of the patterned conductive layer 203 contacts to one end of the conductor strip 213b of the patterned conductive layer 213; the other end of the conductor strip 213b of the patterned conductive layer 213 contacts to one end of the conductor strip 203c of the patterned conductive layer 203; the other end of the conductor strip 203c of the patterned conductive layer 203 contacts to one end of the conductor strip 213c of the patterned conductive layer 213; the other end of the conductor strip 213c of the patterned conductive layer 213 contacts to one end of the conductor strip 203d of the patterned conductive layer 203; and the other end of the conductor strip 203d of the patterned conductive layer 203 contacts to one end of the conductor strip 213d of the patterned conductive layer 213. As a result, an accommodation space 207 is defined by the portion of the conductor strips 203a, 203b, 203c and 203d formed on the sidewalls 202a and the bottom surface 202b of the trench 202 and the portion of the conductor strip 213a, 213b, 213c and 213d formed on the sidewalls 212a and the bottom surface 212b of the trench 212 to allow the magneto-conductive wire 204 passing there through, and at least one coil circuit 208 surrounding the magneto-conductive wire 204 can be formed.

In some embodiments of the present disclosure, before the substrate 201 and the substrate 211 are bonded together, because the trench 202 or the trench 212 (not shown) is filled up with the insulating adhesive, thus after the substrate 201 and the substrate 211 are bonded together, the insulating adhesive can completely covering on the magneto-conductive wire 104, a the encapsulation layer 206 formed subsequently can completely encapsulate the cylinder surface of the magneto-conductive wire 204. As a result, the magneto-conductive wire 204 can be electrically isolated from the patterned conductive layer 213, such as the portions of the conductor strip 213a, 213b, 213c and 213d overlapping with the magneto-conductive wire 204.

Afterwards, a wafer grinding technology is applied to thin the substrates 201 and 211 respectively. Then, a plurality of via-plugs, such as via-plugs 214a, 214b, 214c and 214d, are formed in the substrate 201 and each of which electrically contacts to at least one of the magneto-conductive wire 204, the patterned conductive layer 203 and the patterned conductive layer 213. In the present embodiment, the via-plugs 214a and 214b electrically contact to the conductor strip 203a of the patterned conductive layer 203 and the conductor strip 213d of the patterned conductive layer 213, respectively. The via-plugs 214c and 214d electrically contact to the two ends of the magneto-conductive wire 204, respectively.

Then, a patterned circuit layer 215 is formed on a surface 211b of the substrate 211 opposite to the surface 211a, wherein the patterned circuit layer 215 includes a plurality of pads, such as solder pads 215a, 215b, 215c and 215d, each of which is electrically connected to one of the via-plugs 214a, 214b, 214c and 214d. Meanwhile, the preparation of the electromagnetic impedance sensing device 200 (as shown in FIG. 2D and FIG. 2D') is completed.

Figure 2D:
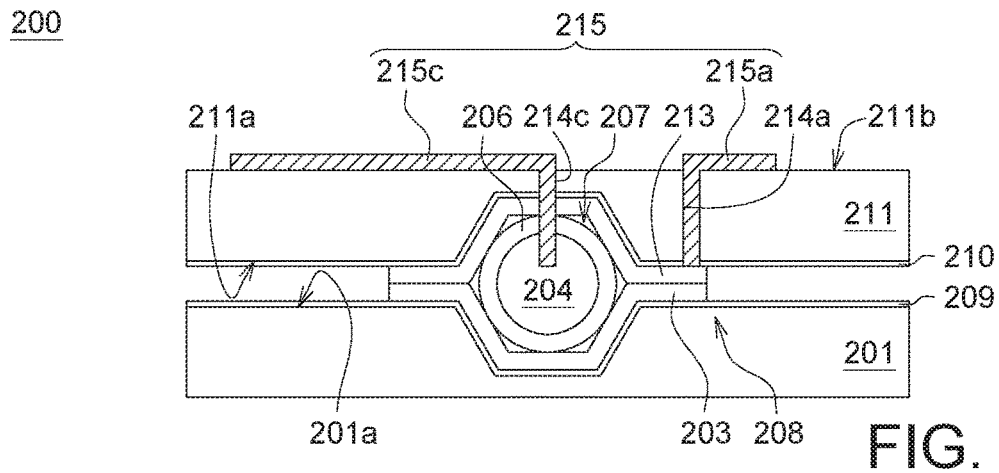
Figure 2D:
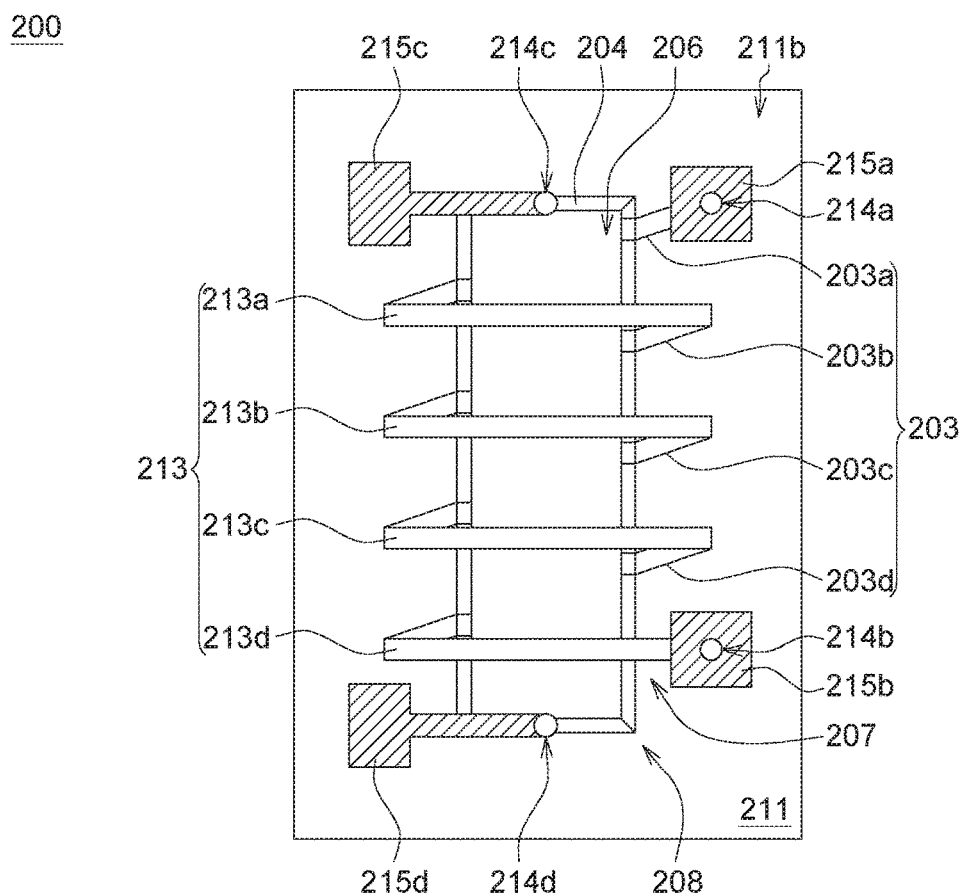

Refer to FIGS. 2D and 2D'. The electromagnetic impedance sensing device 200 manufactured by the above method at least includes a substrate 201, a patterned conductive layer 203, a substrate 211, a patterned conductive layer 213, a magneto-conductive wire 204 and an encapsulation layer 206. Trenches 202 and 212 are respectively formed on a surface 201a of the substrate 201 and a surface 211a of the substrate 211. The patterned conductive layer 203 is disposed on the surface 201a of the substrate 201. The patterned conductive layer 213 is disposed on the surface 211a of the substrate 211. The patterned conductive layers 203 and 213 electrically contact each other and an accommodation space 207 is defined between the patterned conductive layers 203 and 213 to allow the magneto-conductive wire 204 passing there through. The encapsulation layer 206 encapsulates the magneto-conductive wire 204 to make the magneto-conductive wire 204 electrically isolated from the patterned conductive layers 203 and 213 respectively. At least one coil circuit 208 surrounding the magneto-conductive wire 204 is formed by the patterned conductive layers 203 and 213.

When the external magnetic field applied to the magneto-conductive wire 204 changes, current pulse axially passing through the magneto-conductive wire 204 may occur, and an induced voltage may be output by the coil circuit 208 correspondingly, and the change in the external magnetic field can thus be determined. The direction of the current pulse axially flowing through the magneto-conductive wire 104 is reverse to the direction of the current flowing through coil circuit 208.

According to the above embodiments of the present disclosure, Let the electromagnetic impedance sensing device 200 of FIG. 2C and FIG. 2C' be taken for example. Firstly, two patterned conductive layers 203 and 213 are formed on two substrates 201 and 211 respectively. Then, the two substrates 201 and 211 are bonded together to make the two patterned conductive layers 203 and 213 disposed on different substrates 201 and 211 electrically contacting with each other and to define an accommodation space 207 there between allowing a magneto-conductive wire 204 passing through, whereby at least one coil circuit 208 surrounding the magneto-conductive wire 204 is formed.

During the process of manufacturing the electromagnetic impedance sensing device 200, except for the step of bonding the two substrates 201 and 211, any other aligning process used to align the magneto-conductive wire 204 with one of the patterned conductive layers 203 and 213 is no more necessary. Additionally, since the encapsulation layer 206 is formed by directly filling an insulating material 205 into the two trenches 202 and 212 that are respectively formed on the two substrates 201 and 211 used to define the accommodation space 207, thus extra step for patterning the encapsulation layer 206 can be omitted, and the manufacturing process can be simplified and the manufacturing time can be reduced. Besides, because the two patterned conductive layers 203 and 213 are both formed on a relatively flat surface, the defocus problems of the photolithography process can be avoided by virtue of the fact that the step height existing between the magneto-conductive wire 204 and the substrate 201 and 211 can be eliminated by fixing the magneto-conductive wire 204 in the trenches 202 and 212 and the subsequent process can be performed on a relatively flat surface. Thus, the objects of reducing feature size, increasing the number of coils and enhancing element sensitivity can be achieved accordingly. In addition, the aforementioned process can be applied by a wafer scaled process which allows multiple electromagnetic impedance sensing devices being manufactured, packaged and tested on one wafer, thus the process efficiency for manufacturing the electromagnetic impedance sensing devices can be greatly increased.

It will be apparent to those skilled in the art that various modifications and variations are made to the disclosed embodiments. It is intended that the specification and examples be considered as exemplary only, with a true scope of the disclosure being indicated by the following claims and their equivalents.

What is claimed is:

1. An electromagnetic impedance sensing device, comprising:
   a first substrate having a first surface with a first trench;
   a first patterned conductive layer formed on the first surface;
   a second substrate having a second surface facing to the first surface;
   a second patterned conductive layer formed on the second surface, electrically contacted to and physically integrated with the first patterned conductive layer, wherein an accommodation space is defined by a portion of the first patterned conductive layer covering sidewalls and a bottom surface of the first trench, and a portion of the second patterned conductive layer extending across the first trench;
   a magneto-conductive wire passing through the accommodation space; and
   an encapsulation layer encapsulating the magneto-conductive wire, so to make the magneto-conductive wire electrically isolated from the first patterned conductive layer and the second patterned conductive layer respectively;
   wherein at least one coil of wire surrounding the magneto-conductive wire is formed by the first patterned conductive layer and the second patterned conductive layer.

2. The electromagnetic impedance sensing device according to claim 1, wherein the second surface has a second trench, and a portion of the second patterned conductive layer is formed on sidewalls and a bottom surface of the second trench, and the portion of the second patterned conductive layer extends across the first trench and is integrated with the portion of the first patterned conductive layer covering the sidewalls and the bottom surface of the first trench to define the accommodation space.

3. The electromagnetic impedance sensing device according to claim 2, wherein the encapsulation layer entirely fills up the first trench and the second trench.

4. The electromagnetic impedance sensing device according to claim 1, wherein the first substrate and the second substrate are made of a semiconductor material; and the electromagnetic impedance sensing device further comprises a first insulating layer disposed between the first substrate and the first patterned conductive layer and a second insulating layer disposed between the second substrate and the second patterned conductive layer.

5. A manufacturing method of an electromagnetic impedance sensing device, comprising:
   forming a first patterned conductive layer on a first surface of a first substrate;
   forming a second patterned conductive layer on a second surface of a second substrate;
   disposing a magneto-conductive wire on the first surface to make the magneto-conductive wire electrically isolated from the first patterned conductive layer; and
   bonding the first substrate with the second substrate, to make the first patterned conductive layer and second patterned conductive layer electrically contacted each other and to define an accommodation space allowing the magneto-conductive wire passing there through, whereby at least one coil circuit surrounding the magneto-conductive wire is formed by the first patterned conductive layer and second patterned conductive layer.

6. The manufacturing method of an electromagnetic impedance sensing device according to claim 5, wherein the step of disposing the magneto-conductive wire on the first surface comprises:
   disposing the magneto-conductive wire in a first trench formed on the first surface; and
   forming an encapsulation layer to encapsulate the magneto-conductive wire to make the magneto-conductive wire electrically isolated from a portion of the first patterned conductive layer formed on sidewalls and a bottom surface of the first trench.

7. The manufacturing method of an electromagnetic impedance sensing device according to claim 6, wherein the second surface has a second trench; a portion of the second patterned conductive layer is formed on sidewalls and a bottom surface of the second trench; and the portion of the second patterned conductive layer is integrated with the portion of the first patterned conductive layer formed on the sidewalls and the bottom surface of the first trench to define the accommodation space.

8. The manufacturing method of an electromagnetic impedance sensing device according to claim 5, wherein the first substrate and the second substrate are made of a semiconductor material, and before the forming of the first patterned conductive layer and the second patterned conductive layer, the method further comprises:
   forming a first insulating layer on the first surface; and
   forming a second insulating layer on the second surface.

9. The manufacturing method of an electromagnetic impedance sensing device according to claim 8, after the forming of the coil circuit further comprising:
   thinning the first substrate;
   forming a plurality of via-plugs penetrating the first substrate and the first insulating layer to electrically contact at least one of the magneto-conductive wire, the first patterned conductive layer and the second patterned conductive layer; and
   forming a patterned circuit layer on a third surface of the first substrate opposite to the first surface, wherein the patterned circuit layer comprises a plurality of pads each of which electrically contacts one of the via-plugs.

* * * * *